(12) United States Patent
Yousef (10) Patent No.: US 8,086,940 B2
(45) Date of Patent: Dec. 27, 2011

(54) ITERATIVE DECODING BETWEEN TURBO AND RS DECODERS FOR IMPROVING BIT ERROR RATE AND PACKET ERROR RATE

(75) Inventor: Nabil Yousef, Foothill Ranch, CA (US)

(73) Assignee: Newport Media, Inc., Lake Forest, CA (US)

( * ) Notice: Subject to any disclaimer, the term of this patent is extended or adjusted under 35 U.S.C. 154(b) by 912 days.

(21) Appl. No.: 12/110,647

(22) Filed: Apr. 28, 2008

(65) Prior Publication Data

US 2009/0271684 A1    Oct. 29, 2009

(51) Int. Cl.
    *H03M 13/00*    (2006.01)
(52) U.S. Cl. ................................ 714/778
(58) Field of Classification Search .......... 714/778
    See application file for complete search history.

(56) References Cited

U.S. PATENT DOCUMENTS

| | | | |
|---|---|---|---|
| 6,961,388 B2* | 11/2005 | Ling et al. | 375/267 |
| 7,613,256 B2* | 11/2009 | van Veen et al. | 375/340 |
| 2006/0156167 A1* | 7/2006 | Dielissen et al. | 714/752 |
| 2007/0071140 A1* | 3/2007 | Sontowski | 375/341 |
| 2007/0118786 A1* | 5/2007 | Lim et al. | 714/751 |
| 2007/0171730 A1* | 7/2007 | Ramamoorthy et al. | 365/185.33 |
| 2008/0072123 A1* | 3/2008 | Eidson et al. | 714/786 |
| 2008/0115031 A1* | 5/2008 | Shen | 714/755 |
| 2008/0148128 A1* | 6/2008 | Sharon et al. | 714/758 |
| 2009/0031185 A1* | 1/2009 | Xhafa et al. | 714/751 |
| 2009/0132896 A1* | 5/2009 | Valadon | 714/792 |
| 2009/0199062 A1* | 8/2009 | Shen et al. | 714/748 |

* cited by examiner

*Primary Examiner* — Robert Beausoliel, Jr.
*Assistant Examiner* — Neil Miles
(74) *Attorney, Agent, or Firm* — Rahman LLC

(57) ABSTRACT

A technique for iterative decoding between turbo and Reed Solomon (RS) decoders for improving bit error rate (BER) and packet error rate (PER) in a receiver in a wireless communication system comprises receiving data samples comprising turbo encoded packets and RS code words at the receiver; decoding turbo encoded packets of the received data samples using a turbo decoder; decoding RS code words of the received data samples using a RS decoder; feeding the RS decoded data to turbo decoder to perform a plurality of iterations; and correcting data errors present in the received data samples.

20 Claims, 9 Drawing Sheets

ITERATIVE DECODING BETWEEN TURBO AND RS DECODERS FOR IMPROVING BIT ERROR RATE AND PACKET ERROR RATE

BACKGROUND

1. Technical Field

The embodiments herein generally relate to digital communication networks based on the MediaFLO™ system, and more particularly, to decoding techniques to improve Bit Error Rate (BER) and Packet Error Rate (PER).

2. Description of the Related Art

In recent years, the wireless industry has seen explosive growth in device capability, especially in relation to mobile devices, such as cell phones, handhelds, gaming consoles, etc. Ever-increasing demand for computing power, memory, and high-end graphic functionalities has accelerated the development of new and exciting wireless services. In the last few years, multiple technologies have been proposed to address delivery of streaming multimedia to mobile devices.

Multimedia communications provide a rich and immediate environment of image, graphics, sound, text and interaction through a range of technologies. An example of multimedia communication is streaming multimedia which is primarily a delivery of continuous synchronized media data. The streaming multimedia is constantly received by, and displayed to an end user while it is being delivered by a provider. Multiple technologies such as Integrated Services Digital Broadcasting-Terrestrial (ISDB-T), Terrestrial-Digital Multimedia Broadcasting (T-DMB), Satellite-Digital Multimedia Broadcasting (S-DMB), Digital Video Broadcasting-Handheld (DVB-H), and FLO (Forward Link Only) are used to address the delivery of streaming multimedia to mobile devices. These technologies have typically leveraged upon either third generation cellular/PCS, or digital terrestrial TV broadcast technologies.

For delivering unprecedented volumes of high-quality, streaming or clipped, audio and video multimedia to wireless subscribers, an air interface has been developed based on FLO technology for MediaFLO™ mobile multimedia multicast system available from Qualcomm, Inc., California, USA. MediaFLO™ or media forward link only is a combination of the media distribution system and the FLO technology. The FLO technology is the ability to deliver a rich variety of content choice to consumers while efficiently utilizing spectrum as well as effectively managing capital and operating expenses for service providers. The details of the MediaFLO™ mobile multimedia multicast system are available in Chari, M. et al., "FLO Physical Layer: An Overview," IEEE Transactions on Broadcasting, Vol. 53, No. 1, March 2007, the contents of which, in its entirety, is herein incorporated by reference.

FLO technology was designed specifically for the efficient and economical distribution of the same multimedia content to millions of wireless subscribers simultaneously. Also, the FLO technology was designed from the ground up to be a multicasting network, which is overlaid upon a cellular network. It does not need to support any backward compatibility constraints. Thus, both the network infrastructure and the receiver devices are separate from those for the cellular/PCS network. Moreover, as the name suggests, the technology relies on the use of a forward link (network to device) only.

FLO enables reducing the cost of delivering such content and enhancing the user experience, allowing consumers to "surf" channels of content on the same mobile handsets they use for traditional cellular voice and data services.

MediaFLO™ technology can provide robust mobile performance and high capacity without compromising power consumption. The technology also reduces the network cost of delivering multimedia content by dramatically decreasing the number of transmitters needed to be deployed. In addition, MediaFLO™ technology-based multimedia multicasting complements wireless operators' cellular network data and voice services, delivering content to the same cellular handsets used on 3 G networks.

The MediaFLO™ wireless system has been designed to broadcast real time audio and video signals, apart from non-real time services to mobile users. The system complements existing networks and radically expands the ability to deliver desired content without impacting the voice and data services. Operators can leverage the MediaFLO™ system to increase average revenue per user (ARPU) and reduce churn by offering enhanced multimedia services. Content providers can take advantage of a new distribution channel to extend their brand to mobile users. Device manufacturers will benefit from increased demand for multimedia-enabled handsets as consumer appetite grows for the rich content provided through MediaFLO™ systems.

The MediaFLO™ service is designed to provide the user with a viewing experience similar to a television viewing experience by providing a familiar type of program-guide user interface. Users can simply select a presentation package, or grouping of programs, just as they would select a channel to subscribe to on television. Once the programs are selected and subscribed to, the user can view the available programming content at any time. In addition to viewing high quality video and audio content and IP data, the user may also have access to related interactive services, including the option to purchase a music album, ring tone, or download of a song featured in a music program. The user can also purchase access to on-demand video programming, above and beyond the content featured on the program guide.

The respective MediaFLO™ system transmission is carried out using tall and high power transmitters to ensure wide coverage in a given geographical area. Further, it is common to deploy 3-4 transmitters in most markets to ensure that the MediaFLO™ system signal reaches a significant portion of the population in a given market. During the acquisition process of a MediaFLO™ system data packet several determinations and computations are made to determine such aspects as frequency offsets for the respective wireless receiver. Given the nature of MediaFLO™ system broadcasts that support multimedia data acquisitions, efficient processing of such data and associated overhead information is paramount. For instance, when determining frequency offsets or other parameters, complex processing and determinations are required where determinations of phase and associated angles are employed to facilitate the MediaFLO™ system transmission and reception of data. To achieve good receiver performance and high spectral efficiency of multimedia multicasting in a mobile communication environment, the FLO physical layer uses Orthogonal Frequency Division Multiplexing (ODFM) as the modulation technique. Inside an ODFM symbol, a Wide-area Identification Channel (WIC) spans one OFDM symbol and is transmitted at ODFM symbol index 1 in a superframe. It follows the Time Division Multiplexing (TDM) Pilot 1 ODFM symbol. This is an overhead channel that is used for conveying the Wide-area Differentiator (WID) to the FLO receivers. The Local-area Identification Channel (LIC) spans one ODFM symbol and is transmitted at ODFM symbol index 2 in a superframe. It follows the WIC channel ODFM symbol. This is an overhead channel that is used for conveying the Local-area Differentiator (LID) information to the FLO receivers.

At the receiver, the device first decodes turbo encoded packets, and then decodes the RS code word. In some cases, the turbo decoder will correct some of the errors at the packet, and there will be still some error not corrected. When the device applies the RS decoder on the turbo decoder output known as log likelihood ratio (LLR), the RS decoder again will correct some of the errors and there are some errors that were not corrected, which will result in a given BER and hence a given PER.

SUMMARY

In view of the foregoing, an embodiment herein provides a method for iterative decoding between turbo and Reed Solomon (RS) decoders for improving BER and PER in a receiver in a wireless communication system, and a program storage device, readable by a computer, tangibly embodying a program of instructions executable by the computer to perform the method for iterative decoding between turbo and RS decoders for improving BER and PER in a receiver in a wireless communication system, wherein the method comprises receiving data samples comprising turbo encoded packets and RS code words at the receiver; decoding the turbo encoded packets of the received data samples using a turbo decoder; decoding the RS code words of the received data samples using a RS decoder; feeding the RS decoded data to the turbo decoder to perform a plurality of iterations; and correcting data errors present in the received data samples.

Preferably, decoding the turbo encoded packets of the received data samples using the turbo decoder to obtain estimates of Log Likelihood Ratios (LLRs). Further, the method comprises storing the estimated LLRs comprising a number of bits in memory that failed to be corrected by the turbo decoder. The method further comprises reducing the number of bits of the LLRs according to an available memory space at the receiver. Preferably, the method comprises feeding the RS decoded data to the turbo decoder to perform a plurality of iterations using a selector to determine if the RS decoded data is successfully decoded and feeding the successfully RS decoded data to the turbo decoder and feeding parity bits to the turbo decoder. The method further comprises feeding the turbo decoded data to the turbo decoder if the RS decoded data is not successfully decoded. Preferably, the method further comprises the receiver entering into a sleep mode at instances when channel bursts are not occupying a radio frequency (RF) channel and the turbo decoder and the RS decoder are reused during the sleep mode.

Another embodiment includes an apparatus for iterative decoding between turbo and RS decoders for improving BER and PER in a receiver in a wireless communication system, wherein a processing module comprises receiving data samples comprising turbo encoded packets and RS code words at the receiver; decoding the turbo encoded packets of the received data samples using a turbo decoder; decoding the RS code words of the received data samples using a RS decoder; feeding the RS decoded data to the turbo decoder to perform a plurality of iterations; and correcting data errors present in the received data samples.

Moreover, the apparatus further comprises a third processing module adapted to the decoding the turbo encoded packets of the received data samples using the turbo decoder to obtain estimates of LLRs. Further, storing the estimated LLRs comprising a number of bits in memory that failed to be corrected by said turbo decoder. The method further comprises reducing the number of bits of the LLRs according to an available memory space at the receiver. Preferably, the apparatus further comprises the receiver entering into a sleep mode at instances when channel bursts are not occupying a RF channel and the turbo decoder and the RS decoder are reused during the sleep mode.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a technique for iterative decoding between turbo and RS decoders for improving the BER and PER in a receiver in wireless communication system to improve the quality of the received data. Referring now to the drawings, and more particularly to FIGS. 1 through 11, where similar reference characters denote corresponding features consistently throughout the figures, there are shown preferred embodiments.

Figure 1:
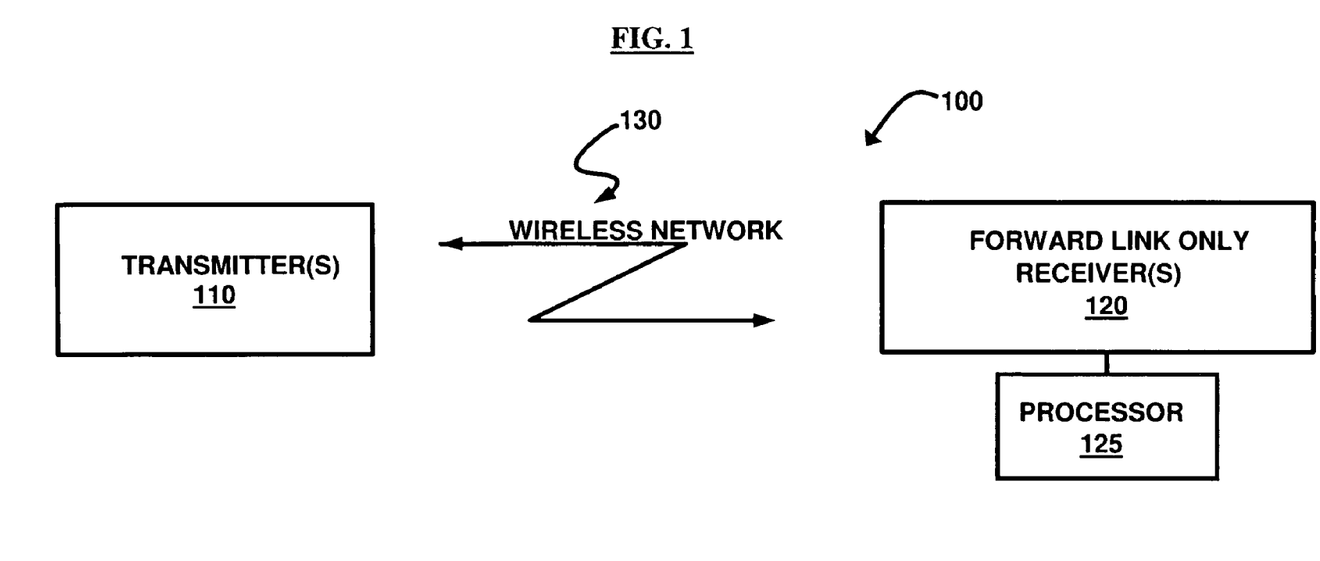
FIG. 1 illustrates a MediaFLO™ system.

The FLO system is comprised of two parts: (a) The FLO network, which includes the collection of transmitters and the backhaul network, and (b) The FLO device, which may be any type of communicating devices such as a cell phone, computer, personal assistant, laptop, handheld, or gaming consoles, etc. FIG. 1 illustrates a FLO system 100 for a MediaFLO™ system. The system 100 includes one or more transmitters 110 that communicate across a wireless network 130 to one or more receivers 120.

The FLO system 100 is utilized in developing an air interface for the MediaFLO™ mobile multicast system. The air interface uses Orthogonal Frequency Division Multiplexing (OFDM) as the modulation technique, which is also utilized by Digital Audio Broadcasting (DAB), (DVD-T), and (ISDB-T).

The information to be transmitted by the transmitter is encoded at the transmitter, in which redundancy bits are added to the original information to enable data errors' detection and correction at the receiver.

In an aspect, encoding is done at the transmitters on streams of data using Reed-Solomon encoders (RS encoders) to obtain an error control block comprising of N bits*122 octets, wherein each octet is an R S Code Word whose length is N bits.

The FLO system is comprised of two parts: (a) The FLO network, which includes the collection of transmitters and the backhaul network, and (b) The FLO device, which may be any type of communicating devices such as a cell phone, computer, personal assistant, laptop, handheld, or gaming consoles, etc. FIG. 1 illustrates a FLO system 100 for a MediaFLO™ system. The system 100 includes one or more transmitters 110 that communicate across a wireless network 130 to one or more receivers 120. A processor 125 receives and processes the symbol streams received by the receiver 120.

To ensure that the user experience is as uniform as possible over the entire coverage area and optimize spectral efficiency and network economics, FLO system 100 employs the concept of Single Frequency Network (SFN) operation.

The FLO system 100 multicasts several services. A service is an aggregation of one or more related data components, such as the video, audio, text or signaling associated with a service. In an embodiment, the services are classified into two types based on their coverage area: Wide-area services and Local-area services. A Local-area service is multicast for reception within a metropolitan area. By contrast, Wide-area services are multicast in one or more metropolitan areas. The term Local-area is used to denote the transmitters within a metropolitan area. The term Wide-area is used to denote transmitters in one or more metropolitan areas that multicast the same Wide-area services. Thus, a Wide-area contains one or more Local-areas, with the transmitters in the different Local-areas multicasting different local area services and in an embodiment, using different radio frequency (RF) center frequencies.

FLO services are carried over one or more logical channels. These logical channels are called Multicast Logical Channels (MLC). An important aspect is that MLCs are distinguishable at the physical layer. For example, the video and audio components of a given service can be sent on two different MLCs. A FLO device (a receiver from the plurality of receivers 120) that is interested in the audio component can only receive the corresponding MLC without receiving the MLC for the video component, thereby saving battery resources.

The statistical multiplexing of different services, or MLCs, is achieved by varying only the MLC time and frequency allocations over prescribed time intervals to match the variability in the MLC's source rates. Statistical multiplexing in FLO enables the receivers 120 to demodulate and decode only the MLC(s) of interest.

FLO incorporates a turbo inner code and a Reed Solomon (RS) outer code. Each turbo code packet contains a Cyclic Redundancy Check (CRC). The RS code need not be calculated for data that is correctly received, which, under favorable signal conditions, results in additional power savings. The FLO technology supports the use of layered modulation. Outer and inner coding is performed independently for the base and enhancement layer, providing adjustment to the relative thresholds of each layer and adjusts the ratio of bandwidths.

The encoding is performed at the transmitter in which redundancy bits are added to original information to enable data errors' detection and correction at the receiver. At the transmitter, encoding is performed on streams of data bits using the Reed-Solomon (RS) encoders to get an error control block composed of N bits*122 octets, wherein each octet is an RS code word whose length is N bits. Each 122 octets are grouped to form 1 MAC layer packet which is in turn encoded (horizontal direction) using turbo encoder.

Cyclic Redundancy Check (CRC) is a type of function that takes as input a data stream of any length and produces as output a value of a certain fixed size. A CRC is an error-detecting code whose computation resembles a long division computation in which that quotient is discarded and the reminder becomes the result, with the important distinction that the arithmetic used in the carry-less arithmetic of a finite field. The length of the reminder is always less than the length of the divisor, which therefore determines how long the result can be.

CRC bits are the bits appended at the end of a MAC layer packet to detect if this packet is correct or not and each MAC layer packet is packet into one Physical Layer Packet (PLP). The transformation of MAC layer packets into PLP bits is conducted by turbo encoder.

At the receiver 120, after demodulation of the received data packets the device first decodes the turbo encoded packet and then decodes the RS code word. The device first decodes the turbo encoded packet based on the received data samples which are estimates called log likelihood ratios (LLR). In some cases, the turbo decoder corrects some of the errors at the packet and there remain some uncorrected data packets. When the device applies the RS decoder, the RS decoder again corrects some of the errors and there may still remain some errors uncorrected. The output bits of the RS decoder and turbo decoder give the BER and PER respectively.

In digital communications, turbo codes are a class of recently-developed high-performance error correction codes finding use in deep space satellite communications and other wireless telecommunication applications where designers seek to achieve maximal information transfer over a limited-bandwidth communication link in the presence of data-corrupting noise.

Turbo codes make it possible to increase data rate without increasing the power of a transmission, or they can be used to decrease the amount of power used to transmit at a certain data rate. The decoder front-end produces an integer for each bit in the data stream. This integer is a measure of how likely it is that the bit is a 0 or 1 and is also called soft bit.

Figure 2:
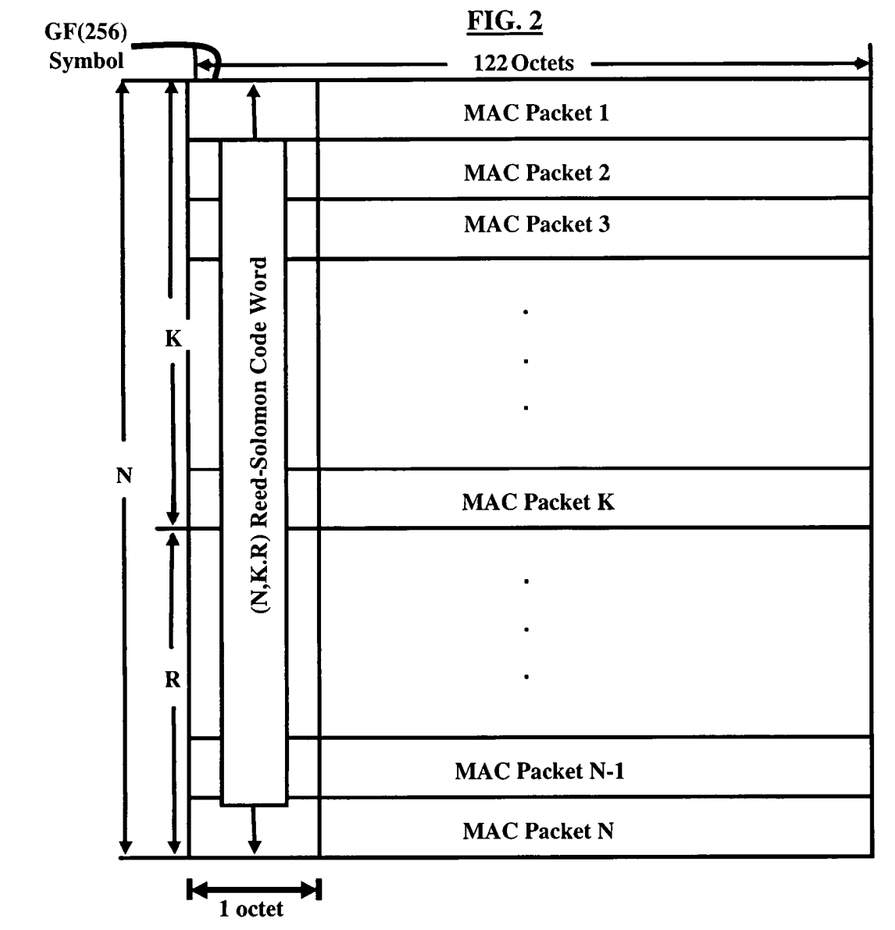
FIG. 2 illustrates a FLO superframe structure for a MediaFLO™ system.

FIG. 2 illustrates Reed-Solomon (RS) encoding. A Reed-Solomon error control block is formed of N rows and 122 octet columns. The top K rows of the error control block each contain a single MAC layer packet. The bottom R=N−K rows of the error control block contain Reed-Solomon parity octets. The parity byes are added to MAC layer packets using RS encoding. In MediaFLO™ system receivers 120, the physical layer provides an error indicator per MAC layer packet, which is called the erasure indicator. An erasure indicator is set if there are one or more bytes contain errors in its corresponding MAC layer packet. In MAC layer, RS decoding can successfully correct up to R MAC layer packet errors with no uncertainty, where all erasure indicators are cleared. If more than R MAC layer packets contain errors, then the RS decoding cannot correct all errors. This causes uncertainty about providing erasure indicators to upper layers to indicate erroneous MAC layer packets. Hence, a MAC layer packet may indicate correct MAC layer packets erroneously.

Figure 3:
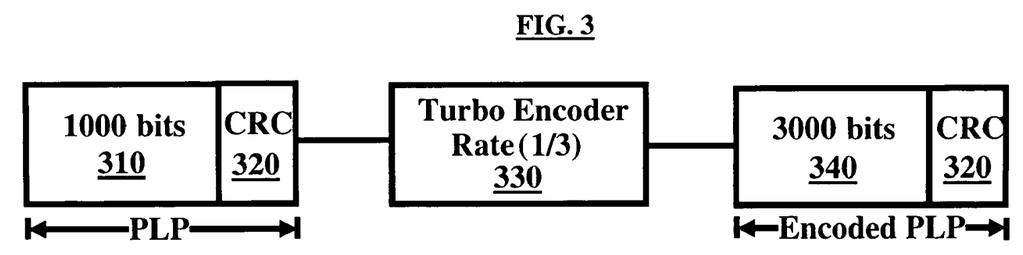
FIG. 3 illustrates a block diagram of transformation of MAC Layer Packet into a Physical Layer Packet (PLP) by a turbo encoder.
Figure 4:
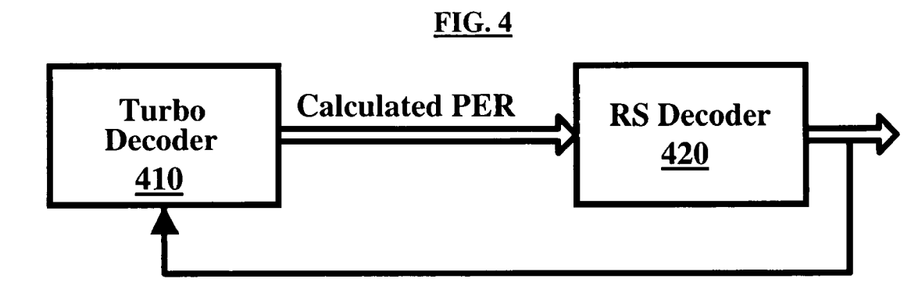
FIG. 4 illustrates a block diagram of a turbo and RS decoder iteration.

FIG. 3 is an illustration of a block diagram of turbo encoding, which uses a turbo encoder 330 that transforms a Physical layer packet 310 with a CRC 320 into an encoded Physical Layer Packet (PLP), which is a combination of a 3000 byte PLP 340 and CRC 320. FIG. 4 is a block diagram illustrating turbo-RS decoder iteration. As shown in FIG. 4, decoder data is transferred from a turbo decoder 410 to a RS decoder 420 using a calculated PER.

Figure 5:
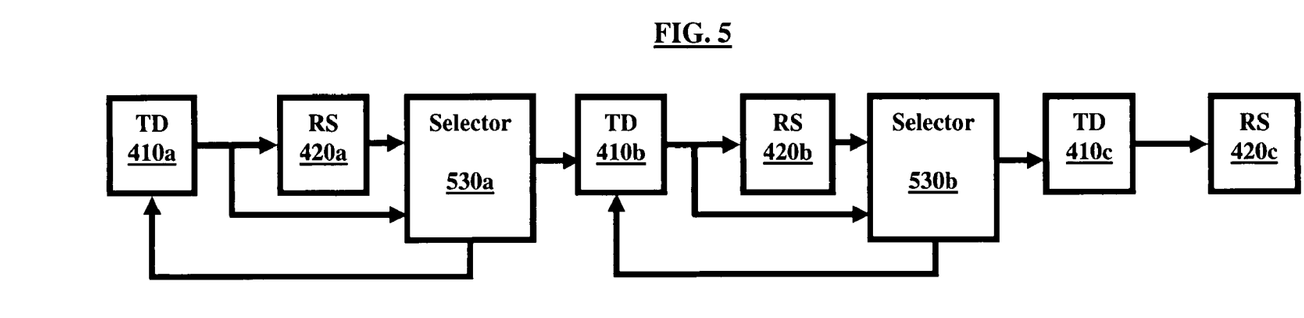
FIG. 5 illustrates a block diagram of turbo and RS decoder multiple iterations.

FIG. 5 is an illustration of multiple iterations of decoding of received data samples. The selector 530*a* between the RS decoder (RS) 420*a* and the turbo decoder (TD) 410*a* first checks if the RS decoder 420*a* was able to correct the data byte. If that byte was successfully decoded, the selector 530*a* selects it and feeds it back to the turbo decoder 410*a* with a statistical high confidence, and at the same time will feed to the turbo decoder 410*a* the parity bits. If the RS decoder 420*a* could not decode the data correctly, the selector 530*a* feeds to the turbo decoder 410*a* the earlier output of the turbo decoder 410*a*. The selector 530*b* repeats the previous process for turbo decoder 410*b* and RS decoder 420*b*. The next turbo decoder 410*c* and RS decoder 420*c* represents further instances of iteration.

Figure 6:
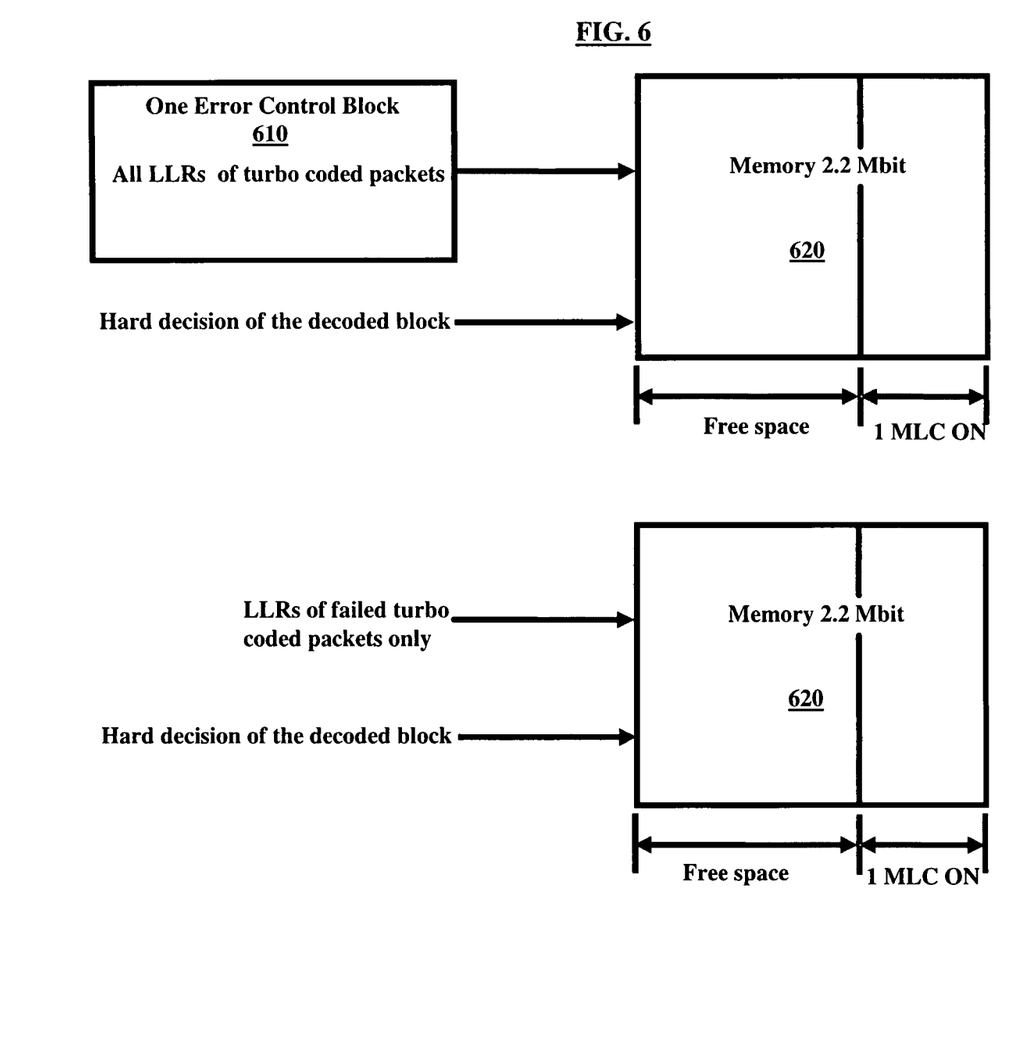
FIG. 6 illustrates a block diagram of memory used for an error control block.

FIG. 6, with reference to FIGS. 1 through 5, illustrates a block diagram of 2.2 M bits memory 620 residing at the receiver 120. The receiver 120 stores the soft decisions LLRs (sampled bits) of the demodulators (not shown) for the turbo decoder 410 to re-use them to re-decode the output from the RS decoder 420. FIG. 6 depicts memory usage while conducting iterative decoding and applying a method for reduced memory usage when one channel blast is ON. For an example, one data packet is of size 1000 bit. Before it gets transmitted it is turbo encoded (⅓ rate) at the transmitter 110 and becomes 3000

$$\left(1000 * \frac{1}{\text{code rate }(1/3)}\right)\text{bit.}$$

At the receiver 120, after demodulation in which each bit is sampled by M bits (LLR) the data packet becomes 15000 (3000*5 if M=5) bit.

Then, at the decoding stage, the output of the turbo decoder 410 is the actual 1000 bit Mac layer packet, and it is called a hard decision. At the RS decoder 420, each RS code word is 16 bits (if N=16) taken from different 16 data packets as illustrated in FIG. 2. Therefore, 16 hard decision outputs of the turbo decoder 410 are stored in the memory space 620. Furthermore, to apply iterations at the decoding stage, the turbo decoder 410*b*, 410*c* of a subsequent iteration waits for one error control block 610, which is 15000*16=15*16 Kbit size. Thus, the total memory space needed is equal to summation of size of one error control block 610 (N*turbo decoded LLRs) and the hard decision (the actual Mac layer packet). To reduce this large memory usage, the embodiments herein provide a method in which the error control block 610 is not stored in the memory 620, but rather the LLRs which failed to be turbo decoded detected by the CRC at the end of each packet. For this method the memory space needed is the summation of size of (N*turbo decoded LLRs)*(% failed turbo coded packets) and the hard decision (the actual Mac layer packet).

Figure 7:
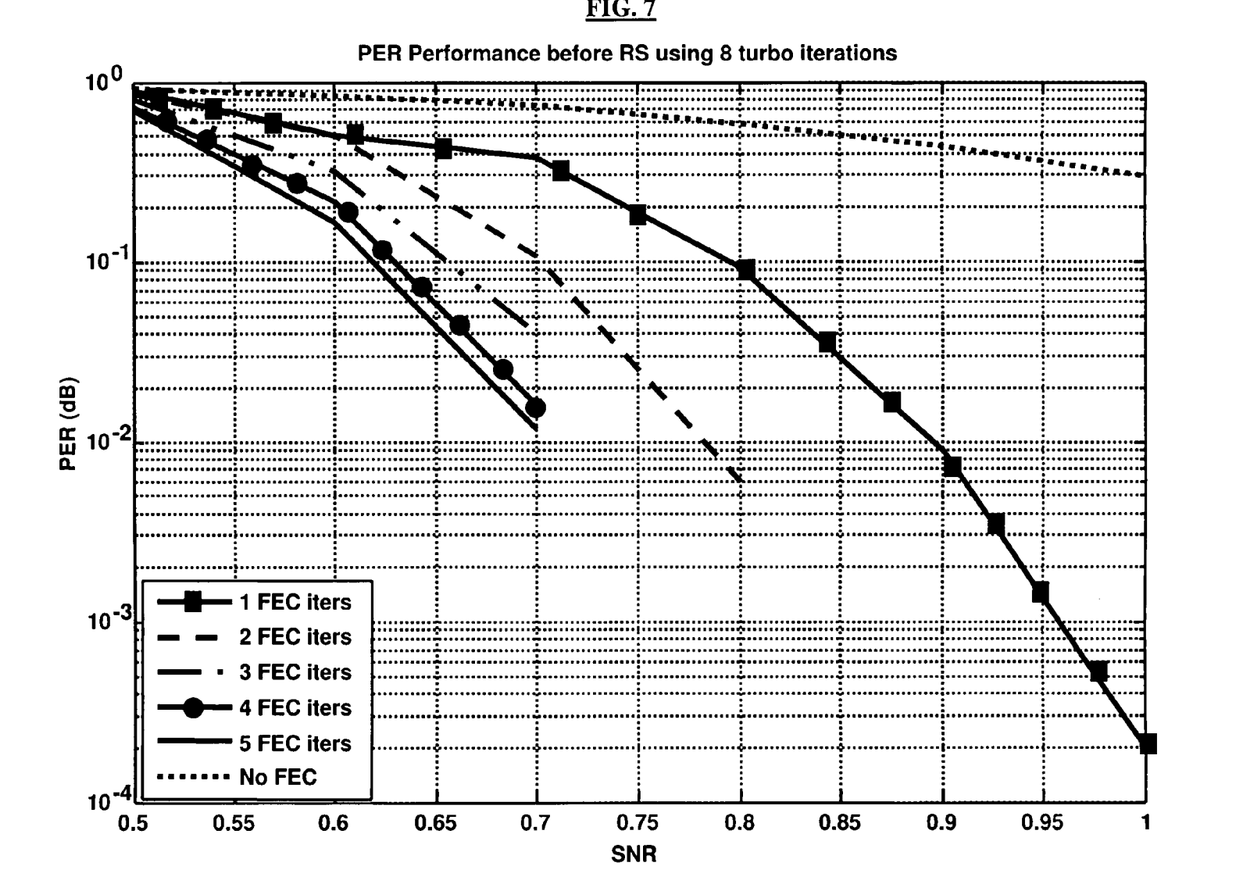
FIG. 7 is a graphical illustration of PER performance before RS decoder application.

FIG. 7, with reference to FIGS. 4 and 5, is a graphical representation of PER performance before applying a RS decoder. The embodiments herein expect that the iterative decoding improves PER, to investigate the same the PER has been measured before the RS decoder for different number of iterations. A 0.45 dB gain in the PER performance is demonstrated before applying the RS decoder 420.

Figure 8:
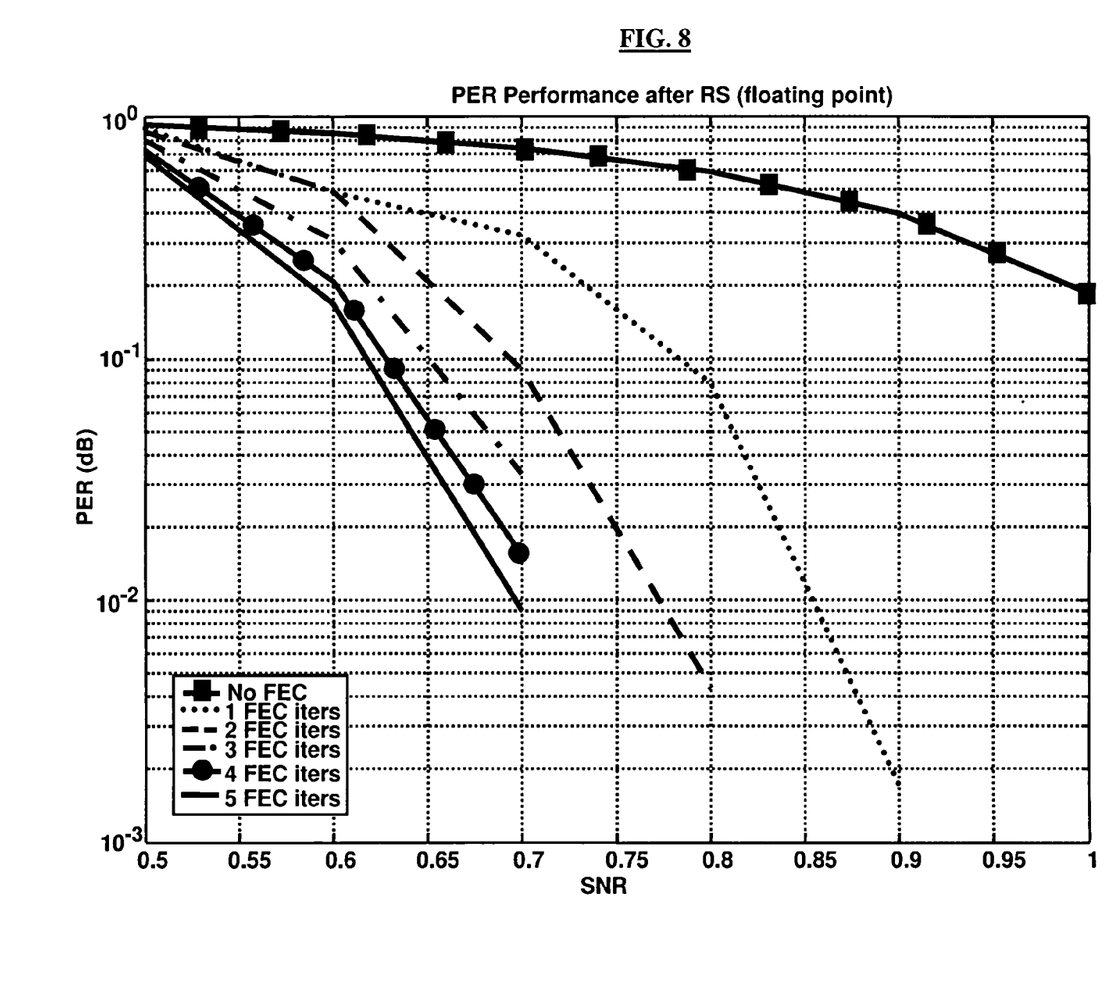
FIG. 8 is a graphical illustration of floating point PER performance after application of a RS decoder.

FIG. 8, with reference to FIGS. 4 and 5, is a graphical representation of a floating point PER performance after the application of a RS decoder 420 to the output data of the turbo decoder 410. The comparison of the PER performance between different iterations is shown. The measuring of the PER performance after the RS decoder 420 when using the floating point as input to the turbo decoder 410 provides an improvement of approximately 0.45 dB in PER performance. The comparison of FIGS. 7 and 8 shows the gain in PER performance.

Figure 9:
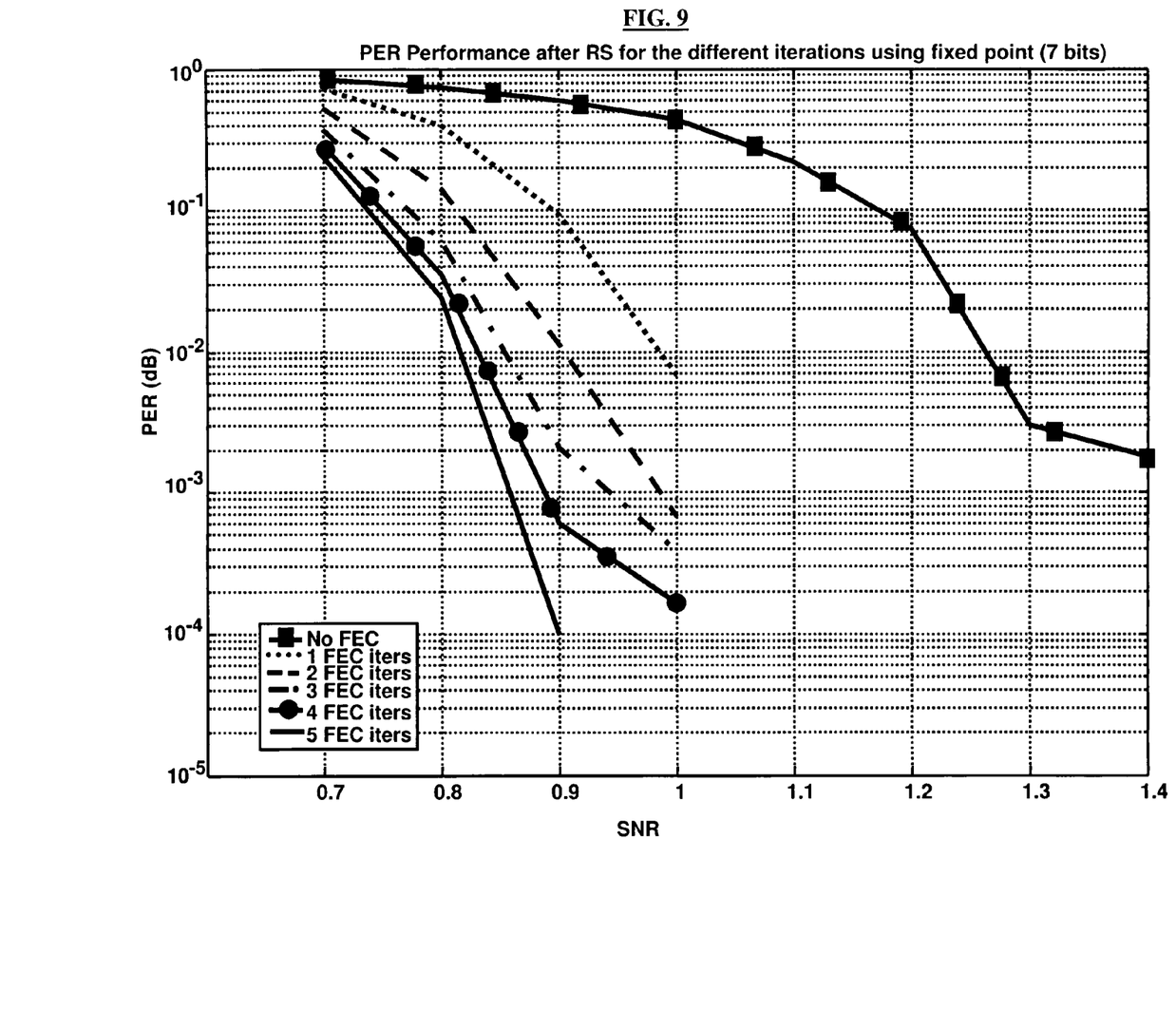
FIG. 9 is a graphical illustration of fixed point PER performance after application of a RS decoder.

FIG. 9, with reference to FIGS. 4 and 5, is a graphical illustration in which the comparison in the PER performance is made after the RS decoder 420 when the input to the turbo decoder 410 is a fixed point (7 bits). A 0.44 dB improvement in the PER performance is shown using this approach. The measurements where performed for floating and fixed points to compare improvement in the PER performance of fixed point bits (7 bits) to that of the floating point (infinite accuracy), the difference was measured to be only 0.01 dB which means that a 7 bit fixed point iterative decoding would have an acceptable performance compared to the floating point iterative decoding.

Figure 10:
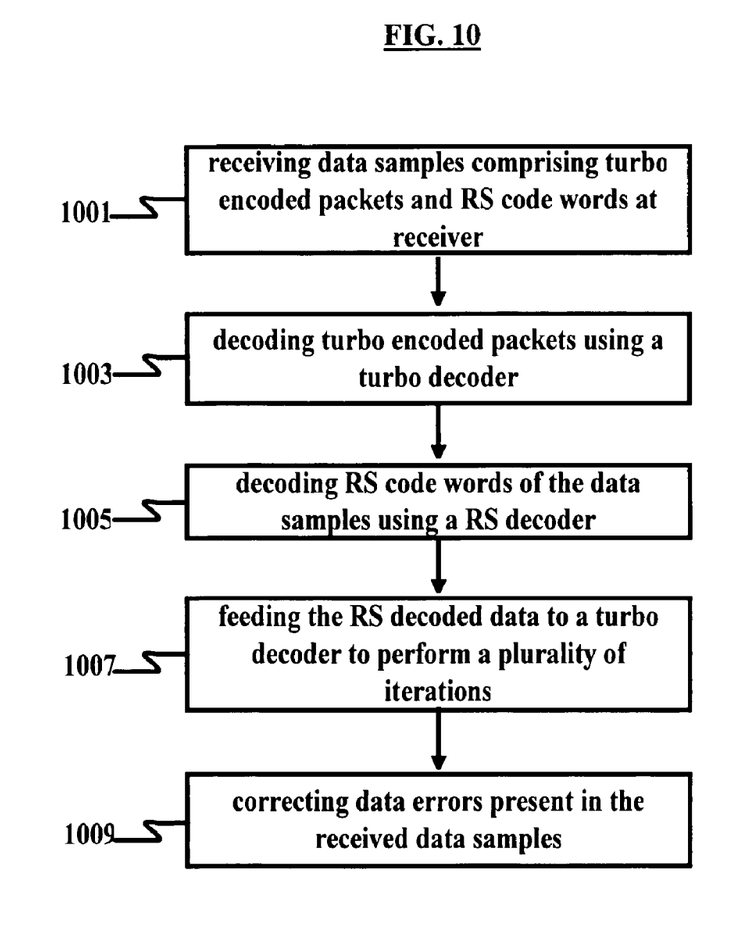
FIG. 10 is a flow diagram illustrating a preferred method according to an embodiment herein.

FIG. 10, with reference to FIGS. 1 through 9, is a flow diagram illustrates a method for iterative decoding between turbo 410 and RS 420 decoders for improving BER and PER in a receiver 120 in a wireless communication system 130, wherein the method comprises receiving (1001) data samples comprising turbo encoded packets and RS code words at the receiver 120; decoding (1003) the turbo encoded packets (340) of the received data samples using a turbo decoder 410; decoding (1005) the RS code words of the received data samples using a RS decoder 420; feeding (1007) the RS decoded data 420*a* to the turbo decoder 410*b* to perform a plurality of iterations; and correcting (1009) data errors present in the received data samples. A selector 530*a* between a turbo decoder 410*a* and a RS decoder 420*a* first checks if the RS decoder 420*a* was able to successfully able correct the data byte, if the data byte was successfully decoded, the selector 530*a* selects it and feeds it back to the turbo decoder 410*a* and at the same time feeds parity bits to the turbo decoder 410*a*. If the data was not corrected by the RS decoder 420*a*, the selector 530*a* feeds it to the turbo decoder 410*a* the output bits of the turbo decoder 410*a*.

Preferably, decoding (1003) the turbo encoded packets of the received data samples using the turbo decoder 410 to obtain estimates of LLRs. Further, the method includes storing the estimated LLRs comprising a number of bits in memory 620 that failed to be corrected by the turbo decoder 410. The method further comprises reducing the number of bits of the LLRs according to an available memory space at the receiver 120. Preferably, the receiver 120 enters into a sleep mode at instances when channel bursts are not occupying a RF channel and the turbo decoder 410 and the RS decoder 420 are reused during the sleep mode.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of an entirely hardware embodiment or an embodiment including both hardware and software elements. Software elements of the embodiments include but are not limited to, firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 11:
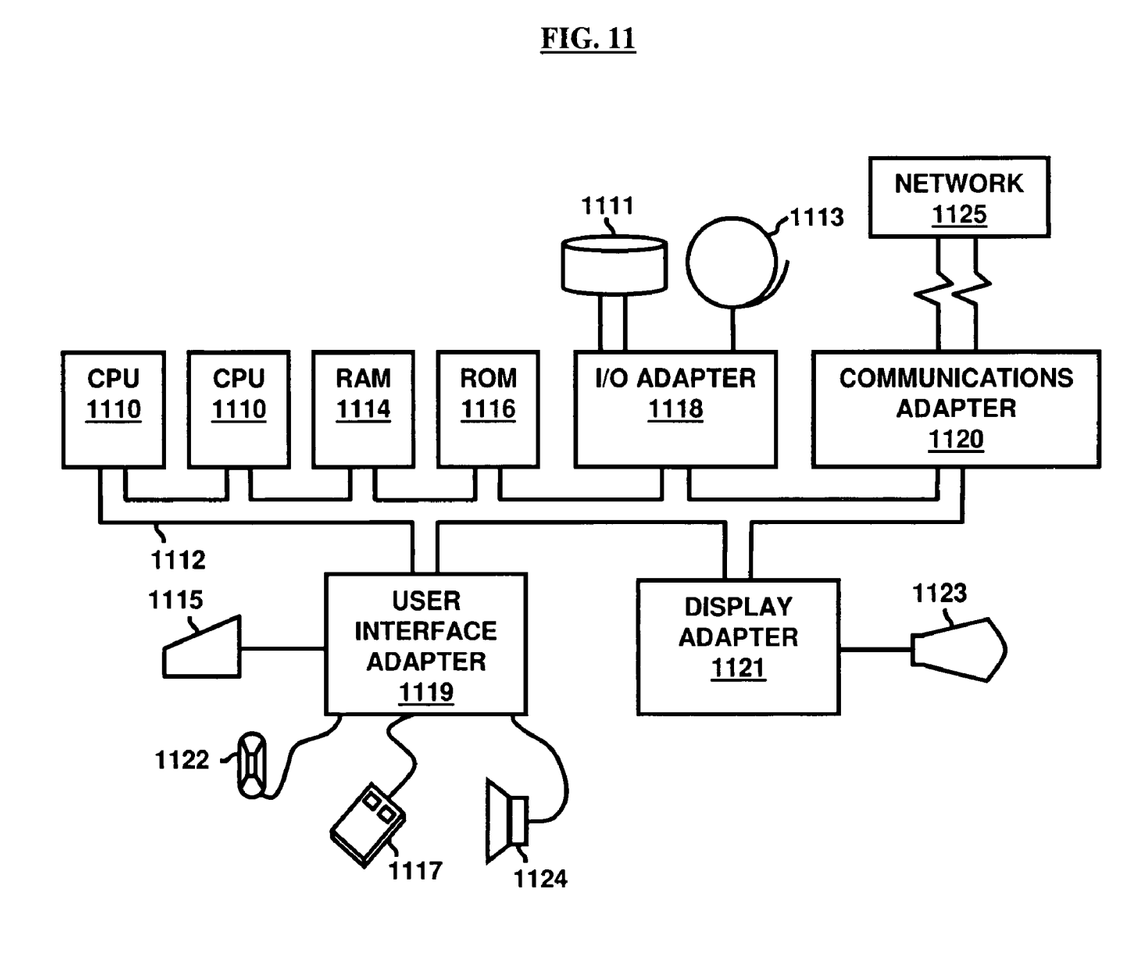
FIG. 11 illustrates a schematic diagram of a computer architecture used in accordance with the embodiments herein.

FIG. 11 depicts a representative hardware environment for practicing the embodiments. This schematic drawing illustrates a hardware configuration of an information handling/computer system in accordance with the embodiments of the invention. The system comprises at least one processor or central processing unit (CPU) 1110. The CPUs 1110 are interconnected via system bus 1112 to various devices such as a random access memory (RAM) 1114, read-only memory (ROM) 1116, and an input/output (I/O) adapter 1118. The I/O adapter 1118 can connect to peripheral devices, such as disk units 1111 and tape drives 1113, or other program storage devices that are readable by the system. The system can read the inventive instructions on the program storage devices and follow these instructions to execute the methodology of the embodiments of the invention. The system further includes a user interface adapter 1119 that connects a keyboard 1115, mouse 1117, speaker 1124, microphone 1122, and/or other user interface devices such as a touch screen device (not shown) to the bus 1112 to gather user input. Additionally, a communication adapter 1120 connects the bus 1112 to a data processing network 1125, and a display adapter 1121 connects the bus 1112 to a display device 1123 which may be embodied as an output device such as a monitor, printer, or transmitter, for example.

The embodiment herein provides a method for improving the iterative decoding between the turbo and RS decoders, and improves the BER and PER, which further improves the quality of decoding of the receipt data samples. In the embodiments herein, the receiver 120 is configured for receiving and storing multiple instances of MLCs comprising turbo encoded packets and RS code words; decoding turbo encoded packets using turbo decoder; if turbo decoder fails to decode the data packet saving turbo decoded LLR bits in receiver memory; decoding RS code words of the received data samples using a RS decoder; determining the correctness of output data bytes of RS code words by a selector; determining between saved turbo decoded bits and RS decoder output as feed for turbo decoder; and re-feeding the data to the turbo decoder to perform plurality of iterations. The selector selects RS code word output as feed if RS code successfully decodes data else selector takes the saved turbo decoder output bits. When the selector finds the RS decoder output correct in the first stage, no iteration is done. If the RS decoder successfully decodes the byte successfully, the Selector sends it as feed to the turbo decoder with parity bits. The larger number of LLR bits ensures better performance of the turbo decoder, so the reduction in the LLR bits can be made adaptive to the memory space which is variable to the reception at that moment. The receiver memory chip saves only one or two bits of the soft decision discard least significant bits (LSB).

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

Therefore, while the embodiments herein have been described in terms of preferred embodiments, those skilled in the art will recognize that the embodiments herein can be practiced with modification within the spirit and scope of the appended claims.

What is claimed is:

1. A method for iterative decoding between turbo and Reed Solomon (RS) decoders for improving bit error rate (BER) and packet error rate (PER) in a receiver in a wireless communication system, said method comprising:
receiving data samples comprising turbo encoded packets and RS code words at said receiver;
decoding said turbo encoded packets of the received data samples using a turbo decoder;
decoding said RS code words of the received data samples using a RS decoder;
feeding the RS decoded data to said turbo decoder to perform a plurality of iterations;
correcting data errors present in said received data samples; and
said receiver entering into a sleep mode at instances when channel bursts are not occupying a radio frequency (RF) channel and said turbo decoder and said RS decoder are reused during said sleep mode.

2. The method of claim 1, further comprising decoding said turbo encoded packets of the received data samples using said turbo decoder to obtain estimates of Log Likelihood Ratios (LLRs).

3. The method of claim 2, further comprising storing said LLRs comprising a number of bits in memory that failed to be corrected by said turbo decoder.

4. The method of claim 3, further comprising reducing said number of bits of said LLRs according to an available memory space.

5. The method of claim 1, wherein feeding the RS decoded data to said turbo decoder to perform a plurality of iterations further comprises:
using a selector to determine if said RS decoded data is successfully decoded; and
feeding the successfully RS decoded data to said turbo decoder and feeding parity bits to said turbo decoder.

6. The method of claim 5, further comprising feeding the turbo decoded data to said turbo decoder if said RS decoded data is not successfully decoded.

7. The method of claim 1, wherein output bits of said RS decoder give said BER and output bits of said turbo decoder give said PER.

8. A non-transitory program storage device, readable by a computer, tangibly embodying a program of instructions executable by said computer to perform a method for iterative decoding between turbo and Reed Solomon (RS) decoders for improving bit error rate (BER) and packet error rate (PER) in a receiver in a wireless communication system, said method comprising:
receiving data samples comprising turbo encoded packets and RS code words at said receiver;
decoding said turbo encoded packets of the received data samples using a turbo decoder;
decoding said RS code words of the received data samples using a RS decoder;
feeding the RS decoded data to said turbo decoder to perform a plurality of iterations;
correcting data errors present in said received data samples; and
said receiver entering into a sleep mode at instances when channel bursts are not occupying a radio frequency (RF) channel and said turbo decoder and said RS decoder are reused during said sleep mode.

9. The program storage device of claim 8, wherein said method further comprises decoding said turbo encoded packets of the received data samples using said turbo decoder to obtain estimates of Log Likelihood Ratios (LLRs).

10. The program storage device of claim 9, wherein said method further comprises storing said LLRs comprising a number of bits in memory that failed to be corrected by said turbo decoder.

11. The program storage device of claim 10, wherein said method further comprises reducing said number of bits of said LLRs according to an available memory space.

12. The program storage device of claim 8, wherein feeding the RS decoded data to said turbo decoder to perform a plurality of iterations further comprises:
using a selector to determine if said RS decoded data is successfully decoded; and
feeding the successfully RS decoded data to said turbo decoder and feeding parity bits to said turbo decoder.

13. The program storage device of claim 12, wherein said method further comprises feeding the turbo decoded data to said turbo decoder if said RS decoded data is not successfully decoded.

14. The program storage device of claim 8, wherein output bits of said RS decoder give said BER and output bits of said turbo decoder give said PER.

15. An apparatus for performing iterative decoding between turbo and Reed Solomon (RS) decoders for improving bit error rate (BER) and packet error rate (PER) in a receiver in a wireless communication system, said apparatus comprising:
a receiver that receives data samples comprising turbo encoded packets and RS code words;
a turbo decoder that decodes said turbo encoded packets of the received data samples;
a RS decoder that decodes said RS code words of the received data samples;
feedback means that feeds the RS decoded data to said turbo decoder to perform a plurality of iterations; and
a control mechanism that corrects data errors present in said received data samples
wherein said receiver enters into a sleep mode at instances when channel bursts are not occupying a radio frequency (RF) channel and said turbo decoder and said RS decoder are reused during said sleep mode.

16. The apparatus of claim 15, wherein said turbo decoder decodes said turbo encoded packets of the received data samples to obtain estimates of Log Likelihood Ratios (LLRs).

17. The apparatus of claim 16, further comprising memory that stores said LLRs comprising a number of bits that failed to be corrected by said turbo decoder; wherein said number of bits of said LLRs are reduced according to an available memory space.

18. The apparatus of claim 15, wherein said feedback means further comprises:
a selector that determines if said RS decoded data is successfully decoded; and
means for feeding the successfully RS decoded data to said turbo decoder and feeding parity bits to said turbo decoder.

19. The apparatus of claim 18, further comprising means for feeding the turbo decoded data to said turbo decoder if said RS decoded data is not successfully decoded.

20. The apparatus of claim 15, wherein output bits of said RS decoder give said BER and output bits of said turbo decoder give said PER.

* * * * *